United States Patent
Kubota et al.

(10) Patent No.: US 12,428,594 B2
(45) Date of Patent: Sep. 30, 2025

(54) PHOSPHOR PLATE AND LIGHT EMITTING DEVICE

(71) Applicant: DENKA COMPANY LIMITED, Tokyo (JP)

(72) Inventors: Yuki Kubota, Tokyo (JP); Taiyo Yamaura, Tokyo (JP); Kazuhiro Ito, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 717 days.

(21) Appl. No.: 17/796,602

(22) PCT Filed: Jan. 28, 2021

(86) PCT No.: PCT/JP2021/002967
§ 371 (c)(1),
(2) Date: Jul. 29, 2022

(87) PCT Pub. No.: WO2021/157458
PCT Pub. Date: Aug. 12, 2021

(65) Prior Publication Data
US 2023/0053528 A1 Feb. 23, 2023

(30) Foreign Application Priority Data

Feb. 7, 2020 (JP) ................. 2020-019401

(51) Int. Cl.
| | | |
|---|---|---|
| *C09K 11/02* | (2006.01) | |
| *C04B 35/117* | (2006.01) | |
| *C04B 35/14* | (2006.01) | |
| *C04B 35/443* | (2006.01) | |
| *C09K 11/77* | (2006.01) | |
| *H10H 20/825* | (2025.01) | |
| *H10H 20/851* | (2025.01) | |

(52) U.S. Cl.
CPC ............ *C09K 11/02* (2013.01); *C04B 35/117* (2013.01); *C04B 35/14* (2013.01); *C04B 35/443* (2013.01); *C09K 11/77348* (2021.01); *H10H 20/825* (2025.01); *H10H 20/8512* (2025.01); *H10H 20/8514* (2025.01); *C04B 2235/3217* (2013.01); *C04B 2235/3218* (2013.01); *C04B 2235/3222* (2013.01); *C04B 2235/3869* (2013.01); *C04B 2235/5436* (2013.01); *C04B 2235/786* (2013.01); *C04B 2235/9646* (2013.01); *H10H 20/8511* (2025.01)

(58) Field of Classification Search
CPC .............. C09K 11/02; C09K 11/77348; H10H 20/8512; H10H 20/8514; H10H 20/825; H10H 20/8511; C04B 35/117; C04B 35/443; C04B 35/14; C04B 2235/3222; C04B 2235/3869; C04B 2235/5436; C04B 2235/3217; C04B 2235/3418; C04B 2235/786; C04B 2235/9642
See application file for complete search history.

(56) References Cited

U.S. PATENT DOCUMENTS

| | | | |
|---|---|---|---|
| 7,824,573 B2 | 11/2010 | Watanabe et al. | |
| 8,125,139 B2 | 2/2012 | Emoto et al. | |
| 8,460,580 B2 | 6/2013 | Watanabe et al. | |
| 8,491,816 B2 | 7/2013 | Hong et al. | |
| 8,801,970 B2 | 8/2014 | Watanabe et al. | |
| 9,024,519 B2 | 5/2015 | Nonogaki et al. | |
| 9,515,230 B2 | 12/2016 | Hirosaki et al. | |
| 9,541,238 B2 | 1/2017 | Hong et al. | |
| 9,570,655 B2 | 2/2017 | Yoshimura et al. | |
| 9,663,713 B2 | 5/2017 | Emoto | |
| 9,666,767 B2 | 5/2017 | Hirosaki et al. | |
| 9,711,686 B2 | 7/2017 | Yoshimura et al. | |
| 10,011,769 B2 | 7/2018 | Hong et al. | |
| 10,125,313 B2 | 11/2018 | Sumino et al. | |
| 10,858,582 B2 | 12/2020 | Hong et al. | |
| 11,807,791 B2* | 11/2023 | Yamaura ............ C09K 11/7734 | |
| 12,284,848 B2* | 4/2025 | Yamaura ............... C04B 35/443 | |
| 12,310,155 B2* | 5/2025 | Kubota ............... H10H 20/8514 | |
| 2009/0021141 A1 | 1/2009 | Emoto et al. | |
| 2009/0134775 A1 | 5/2009 | Watanabe et al. | |
| 2010/0052515 A1 | 3/2010 | Watanabe et al. | |
| 2010/0142189 A1 | 6/2010 | Hong et al. | |
| 2013/0214675 A1 | 8/2013 | Watanabe et al. | |
| 2013/0271960 A1 | 10/2013 | Hong et al. | |
| 2013/0285104 A1 | 10/2013 | Yoshimura et al. | |
| 2013/0293093 A1 | 11/2013 | Nonogaki et al. | |
| 2015/0175881 A1 | 6/2015 | Hirosaki et al. | |
| 2015/0179899 A1 | 6/2015 | Hirosaki et al. | |
| 2016/0204311 A1 | 7/2016 | Yoshimura et al. | |

(Continued)

FOREIGN PATENT DOCUMENTS

| | | |
|---|---|---|
| CN | 105753480 A | 7/2016 |
| JP | 2006-152069 A | 6/2006 |

(Continued)

OTHER PUBLICATIONS

Zhou, Shuzhu et al.; "Silicon Nitride and Theron Ceramic Tool Materials;" Hard Materials and Tools; Metallurgical Industry Press (1st edition); Aug. 31, 2015; pp. 238-239.

(Continued)

*Primary Examiner* — C Melissa Koslow
(74) *Attorney, Agent, or Firm* — Oliff PLC

(57) ABSTRACT

A phosphor plate includes a plate-like composite including a base material and an α-type sialon phosphor present in the base material, in which, in an X-ray diffraction analysis pattern using a Cu-Kα ray, in a case in which peak intensity corresponding to the α-type sialon phosphor having a diffraction angle 2θ in a range of 30.2° or more and 30.4° or less is defined as $I_\alpha$ and peak intensity of a peak having a diffraction angle 2θ in a range of 26.6° or more and 26.8° or less is defined as $I_\beta$, $I_\alpha$, and $I_\beta$ satisfy $0 < I_\beta/I_\alpha \leq 10$.

9 Claims, 2 Drawing Sheets

(56) References Cited

U.S. PATENT DOCUMENTS

| | | |
|---|---|---|
| 2016/0280993 A1 | 9/2016 | Emoto |
| 2017/0158957 A1 | 6/2017 | Hong et al. |
| 2017/0174986 A1 | 6/2017 | Sumino et al. |
| 2018/0273842 A1 | 9/2018 | Hong et al. |
| 2019/0165220 A1* | 5/2019 | Fukui .................... C04B 35/505 |
| 2019/0264100 A1* | 8/2019 | Cozzan ............... C09K 11/7774 |
| 2021/0062085 A1 | 3/2021 | Hong et al. |

FOREIGN PATENT DOCUMENTS

| | | | |
|---|---|---|---|
| JP | 2007-112650 | A | 5/2007 |
| JP | 2008-019407 | A | 1/2008 |
| JP | 2008-095091 | A | 4/2008 |
| JP | 2009-212508 | A | 9/2009 |
| JP | 2015-199640 | A | 11/2015 |
| JP | 2017-057137 | A | 3/2017 |
| JP | 2018-150443 | A | 9/2018 |
| JP | 2019/135543 | * | 8/2019 |
| JP | 2019-135543 | A | 8/2019 |
| KR | 10-2014-0088707 | A | 7/2014 |
| TW | 201235294 | A | 9/2012 |
| TW | 201410847 | A | 3/2014 |
| TW | 201538455 | A | 10/2015 |
| WO | 2006/106948 | A1 | 10/2006 |
| WO | 2012/098932 | A1 | 7/2012 |

OTHER PUBLICATIONS

Mar. 9, 2021 Search Report issued in International Patent Application No. PCT/JP2021/002967.

Oct. 14, 2023 Office Action and Search Report issued in Chinese Patent Application No. 202180012396.X.

Nov. 21, 2024, Office Action issued in Taiwanese Patent Application No. 110103735.

* cited by examiner

FIG.1
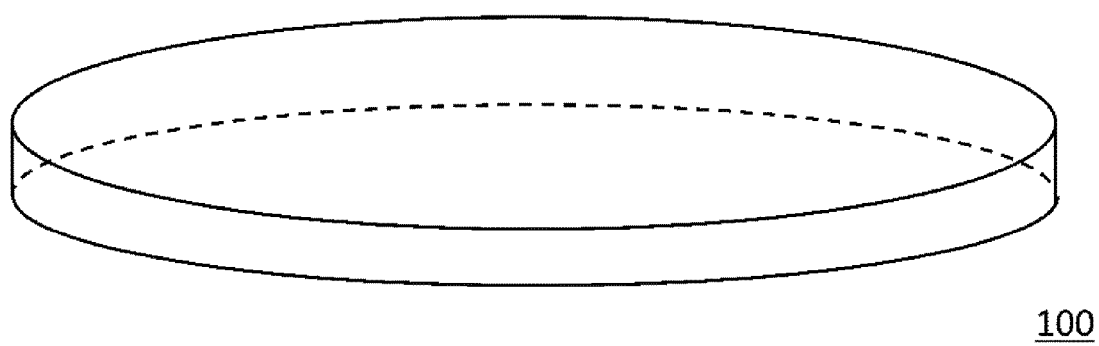
100
FIG2.A
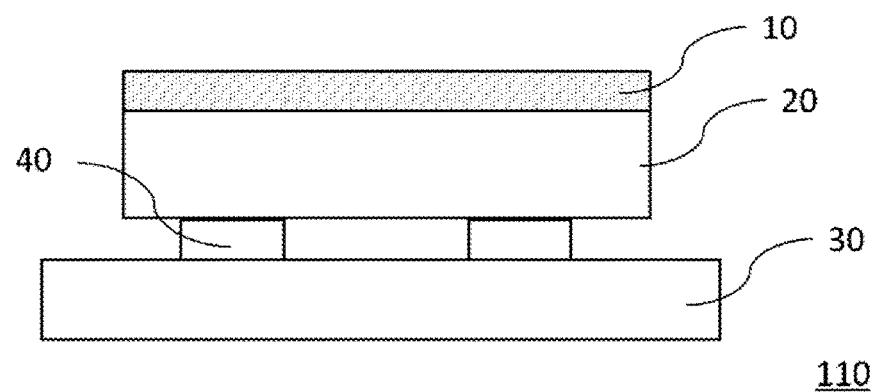
110
FIG2.B
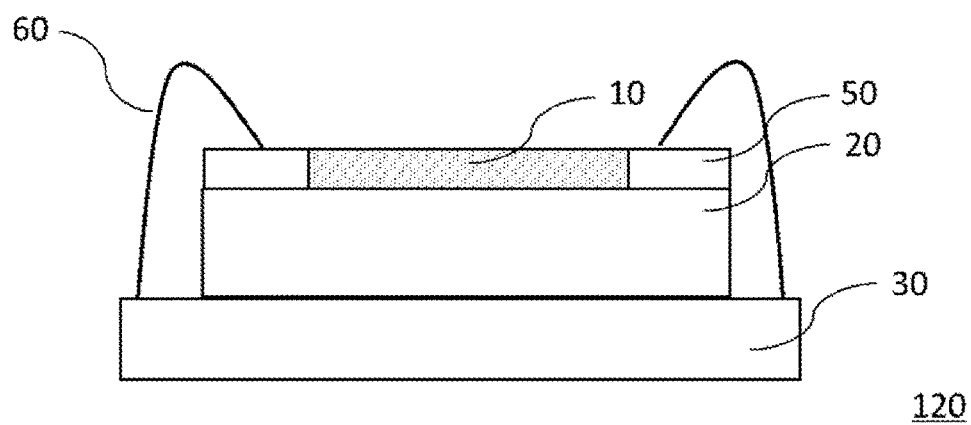
120

PHOSPHOR PLATE AND LIGHT EMITTING DEVICE

TECHNICAL FIELD

The present invention relates to a phosphor plate and a light emitting device.

BACKGROUND ART

Various developments have been made so far on phosphor plates. As a technology of this kind, for example, a technology disclosed in Patent Document 1 is known. Patent Document 1 discloses a wavelength conversion member in which an inorganic phosphor is dispersed in a glass matrix (claim 1 of Patent Document 1). According to Patent Document 1, it is disclosed that a shape of the wavelength conversion member is not limited and may be plate-like (paragraph 0054).

RELATED DOCUMENT

Patent Document

[Patent Document 1] Japanese Unexamined Patent Publication No. 2015-199640

SUMMARY OF THE INVENTION

Technical Problem

However, as a result of the examination by the present inventors, it has been found that there is room for improvement in terms of light emission intensity in the plate-like wavelength conversion member disclosed in Patent Document 1 described above.

Solution to Problem

As a result of further examination, the present inventors have found that, in a case in which an α-type sialon phosphor is used as the inorganic phosphor described above, there is a risk that the light emission intensity is decreased in the phosphor plate. As a result of further diligent research based on such findings, the present inventors have found that, in an X-ray diffraction analysis pattern of the phosphor plate, an optical characteristic can be stably evaluated by using a ratio ($I_\beta/I_\alpha$) of peak intensity of the α-type sialon phosphor to peak intensity of a peak present within a predetermined range of 2θ as an index, and the light emission intensity of the phosphor plate is improved by setting an upper limit of the index $I_\beta/I_\alpha$ to a predetermined value or less, and have completed the present invention.

According to the present invention, provided is a phosphor plate including a plate-like composite including a base material and an α-type sialon phosphor present in the base material, in which, in an X-ray diffraction analysis pattern of the phosphor plate using a Cu-Kα ray, in a case in which peak intensity corresponding to the α-type sialon phosphor having a diffraction angle 2θ in a range of 30.2° or more and 30.4° or less is defined as $I_\alpha$ and peak intensity of a peak having a diffraction angle 2θ in a range of 26.6° or more and 26.8° or less is defined as $I_\beta$, $I_\alpha$ and $I_\beta$ satisfy $0<I_\beta/I_\alpha\leq10$.

In addition, according to the present invention, provided is a light emitting device including a group III nitride semiconductor light emitting element, and the phosphor plate described above provided over one surface of the group III nitride semiconductor light emitting element.

Advantageous Effects of Invention

The present invention is to provide a phosphor plate having excellent light emission intensity and a light emitting device using the same.

BRIEF DESCRIPTION OF THE DRAWINGS

FIG. 1 is a schematic view showing an example of a configuration of a phosphor plate according to the present embodiment.

FIG. 2A is a cross-sectional view schematically showing a configuration of a flip-chip type light emitting device, and FIG. 2B is a cross-sectional view schematically showing a configuration of a wire bonding type light emitting element.

DESCRIPTION OF EMBODIMENTS

Figure 3:
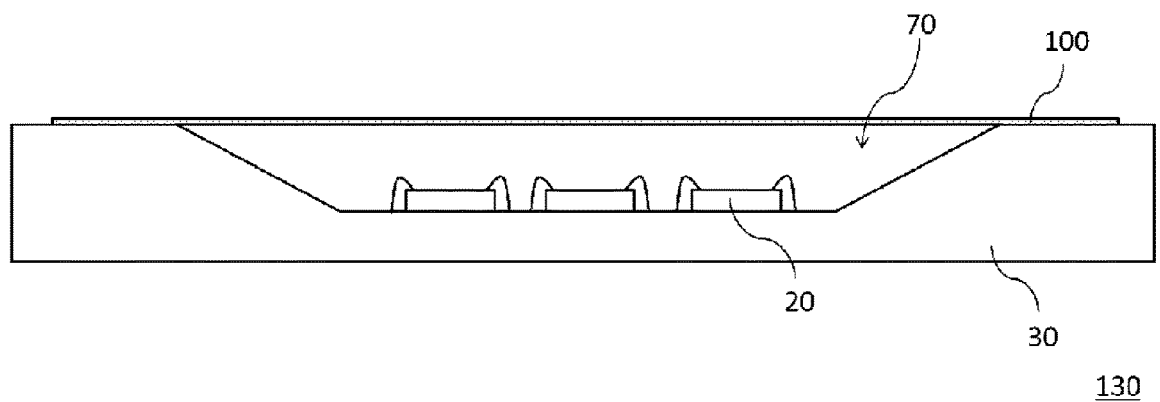
FIG. 3 is a schematic view of a device that measures light emission efficiency of the phosphor plate.

In the following, an embodiment of the present invention will be described below with reference to the drawings. Note that, in all drawings, similar components are designated by the same reference numerals, and the description thereof will not be repeated. In addition, the drawings are schematic views and do not match an actual dimensional ratio.

The phosphor plate according to the present embodiment will be outlined.

An outline of a phosphor plate according to the present embodiment will be described.

The phosphor plate according to the present embodiment is composed of a plate-like member including a plate-like composite including a base material and an α-type sialon phosphor present in the base material.

The phosphor plate can function as a wavelength converter that converts radiated blue light into orange light and emits the converted orange light.

The phosphor plate is configured such that, in an X-ray diffraction analysis pattern measured by the following procedure, in a case in which peak intensity corresponding to the α-type sialon phosphor having a diffraction angle 2θ in a range of 30.2° or more and 30.4° or less is defined as $I_\alpha$ and peak intensity of a peak having a diffraction angle 2θ in a range of 26.6° or more and 26.8° or less is defined as $I_\beta$, $I_\alpha$ and $I_\beta$ satisfy $0<I_\beta/I_\alpha\leq10$.

(Measurement Method of X-Ray Diffraction Pattern)

A diffraction pattern of the phosphor plate is measured by using an X-ray diffraction device based on the following measurement conditions.

The phosphor plate, which is a measurement target, may have a thickness of about 0.18 to 0.22 mm.

(Measurement Conditions)

X-ray source: Cu-Kα ray (λ=1.54184 Å)
Output setting: 40 kV·40 mA
Optical condition at the time of measurement: divergence slit=⅔°
Scattering slit=8 mm
Light receiving slit=open
Position of diffraction peak=2θ (diffraction angle)
Measurement range: 2θ=20° to 40°
Scan speed: 0.5 degrees (2θ)/sec, continuous scan
Sample preparation: the plate-like phosphor plate is placed on a sample holder.

The peak intensity is a value obtained by performing background correction.

According to findings of the present inventors, it has been seen that the optical characteristic of the phosphor plate can be evaluated by using a ratio ($I_\beta/I_\alpha$) of the peak intensity of the α-type sialon phosphor to the peak intensity of the peak present within a predetermined range of 2θ as an index, and as a result of further examination on the range of 2θ of the peak corresponding to $I_\beta$, it has been found that the optical characteristic of the phosphor plate can be stably evaluated by setting the diffraction angle 2θ in the range of 26.6° or more and 26.8° or less. Further, it has been found that the light emission intensity of the phosphor plate can be improved by setting the index $I_\beta/I_\alpha$ found in this way to the above upper limit value or less.

The origin of the peak having the diffraction angle 2θ in the range of 26.6° or more and 26.8° or less is not particularly limited, but a peak corresponding to β-type sialon may be included, and a peak corresponding to a (200) plane of the β-type sialon may be included.

An upper limit of $I_\beta/I_\alpha$ may be 10 or less, preferably 9 or less, and more preferably 8 or less. As a result, it is possible to improve the light emission intensity. On the other hand, a lower limit of $I_\beta/I_\alpha$ is not particularly limited, but may be, for example, more than 0, 0.01 or more, and 0.1 or more. As a result, it is possible to enhance the manufacturing stability of the phosphor plate.

In the present embodiment, $I_\beta/I_\alpha$ described above can be controlled by, for example, appropriately selecting a type or a blending amount of each component contained in the α-type sialon phosphor in the phosphor plate, a preparation method of the α-type sialon phosphor or the phosphor plate, and the like. Among these, for example, appropriately adjusting a firing condition, such as lowering a firing temperature and shortening a firing time at a high temperature, appropriately adjusting a particle diameter of the phosphor, and the like are used an element for setting the $I_\beta/I_\alpha$ described above to a desired numerical range.

In a case in which the phosphor plate described above is irradiated with blue light having a wavelength of 455 nm, it is preferable that the peak wavelength of the wavelength conversion light radiated from the phosphor plate be 585 nm or more and 605 nm or less. In addition, according to this, by combining such a phosphor plate and the light emitting element that emits the blue light, it is possible to obtain a light emitting device that emits the orange light having high luminance.

A configuration of the phosphor plate according to the present embodiment will be described in detail.

(Base Material)

In the composite constituting the phosphor plate described above, the phosphor (α-type sialon phosphor) is in a mixed state in the base material (matrix phase). The mixed state specifically means a state in which the α-type sialon phosphor is dispersed in an inorganic base material serving as the matrix phase. The α-type sialon phosphor in the composite may be uniformly dispersed in the inorganic base material (sintered material of metal oxide) in a particle state.

The base material may be composed of the sintered material of the metal oxide containing at least one of a sintered material of $Al_2O_3$, a sintered material of $SiO_2$, and spinel $M_{2x}Al_{4-4x}O_{6-4x}$ (where, M is at least any of Mg, Mn, and Zn, and 0.2<x<0.6). The sintered material may be used alone or in combination of two or more.

Since the sintered material of $Al_2O_3$ absorbs less visible light, the fluorescence intensity of the phosphor plate can be enhanced. In addition, since the sintered material of $Al_2O_3$ has high thermal conductivity, the heat resistance of the phosphor plate can be improved. Further, since the sintered material of $Al_2O_3$ is also excellent in mechanical strength, the durability of the phosphor plate can be enhanced.

The sintered material of $SiO_2$ may be composed of a glass matrix. As the glass matrix, silica glass or the like is used.

The sintered material containing the spinel is usually obtained by mixing powder of the metal oxide represented by a general formula MO (M is at least any of Mg, Mn, and Zn) and powder of $Al_2O_3$ and sintering the mixture.

Stoichiometrically, the spinel has a composition represented by x=0.5 (that is, a general formula $MAl_2O_4$). Note that, depending on a ratio between an amount of MO and an amount of $Al_2O_3$, which are raw materials, the spinel is a compound having a non-stoichiometric composition in which MO or $Al_2O_3$ is excessively dissolved.

A sintered body containing the spinel represented by the general formula described above is relatively transparent. Therefore, excessive scattering of the light in the phosphor plate is suppressed. From the viewpoint of transparency, it is preferable that M in the general formula described above be Mg.

(α-Type Sialon Phosphor)

The α-type sialon phosphor according to the present embodiment includes α-type sialon phosphor containing an Eu element represented by the following general formula (1).

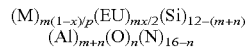
General Formula (1)

In the general formula (1) described above, M represents one or more elements selected from the group consisting of Li, Mg, Ca, Y, and a lanthanide element (excluding La and Ce), p represents a valence of an M element, 0<x<0.5, 1.5≤m≤4.0, and 0≤n≤2.0. n may be 2.0 or less, 1.0 or less, or 0.8 or less, for example.

In a solid solution composition of the α-type sialon, m Si—N bonds of an α-type silicon nitride unit cell ($Si_{12}N_{16}$) are substituted with Al—N bonds, and n Si—N bonds thereof are substituted with Al—O bonds, m/p cations (M, Eu) are solid-dissolved into a crystal lattice in order to maintain electrical neutrality, and it is represented the general formula (1) described above. In particular, in a case in which Ca is used as M, the α-type sialon is stabilized in a wide composition range, and the light having a wide wavelength from ultraviolet to blue is excited, and the phosphor showing visible emission light from yellow to orange can be obtained by substituting a part thereof with Eu which is a center of light emission.

In general, since the α-type sialon has a second crystal phase different from the α-type sialon or an amorphous phase that is inevitably present, the solid solution composition cannot be strictly defined by composition analysis and the like. The α-type sialon may contain, as another crystal phase, β-type sialon, aluminum nitride or its polytypoid, $Ca_2Si_5N_8$, $CaAlSiN_3$, and the like.

As a manufacturing method of the α-type sialon phosphor, there is a method in which mixed powder consisting of a compound of silicon nitride, aluminum nitride, and an infiltrated solid solution element is heated and reacted in a high temperature nitrogen atmosphere. In a heating step, a part of the constituent components forms a liquid phase, and a substance is moved to the liquid phase to generate an α-type sialon solid solution. In the α-type sialon phosphor after synthesis, a plurality of equiaxed primary particles are sintered to form massive secondary particles. The primary particles in the present embodiment refer to the smallest particles having the same crystal orientation in the particles and capable of being present independently.

A lower limit of an average particle diameter of the α-type sialon phosphor is, for example, preferably 1 μm or more, and more preferably 2 μm or more. As a result, it is possible to enhance the light emission intensity. In addition, an upper limit of the average particle diameter of the α-type sialon phosphor is preferably 30 μm or less, more preferably 20 μm or less. The average particle diameter of the α-type sialon phosphor is a dimension of the secondary particles described above. By setting the average particle diameter of the α-type sialon phosphor to 5 μm or more, it is possible to further enhance the transparency of the composite. On the other hand, by setting the average particle diameter of the α-type sialon phosphor to 30 μm or less, it is possible to suppress the occurrence of chipping in a case in which the phosphor plate is cut with a dicer or the like.

Here, the average particle diameter of the α-type sialon phosphor refers to a particle diameter D50 of 50% of a passing amount integration (integrated passing amount ratio) from a small particle diameter side in a volume-based particle diameter distribution obtained by measurement by a laser diffraction/scattering type particle diameter distribution measurement method (LS13-320 manufactured by Beckman Coulter, Inc).

A lower limit value of a content of the α-type sialon phosphor is, for example, 5 Vol % or more, preferably 10 Vol % or more, and more preferably 15 Vol % or more in terms of volume with respect to the entire composite. As a result, it is possible to enhance the light emission intensity in the phosphor plate having a thin layer. In addition, it is possible to improve the light conversion efficiency of the phosphor plate. On the other hand, an upper limit value of the content of the α-type sialon phosphor is, for example, 50 Vol % or less, preferably 45 Vol % or less, and more preferably 40 Vol % or less in terms of volume with respect to the entire composite. It is possible to suppress the decrease in the thermal conductivity of the phosphor plate.

At least a main surface of the phosphor plate described above, or both surfaces of the main surface and a back surface may be subjected to surface treatment. Examples of the surface treatment include grinding by using a diamond grindstone or the like, and polish such as lapping and polishing.

A surface roughness Ra on the main surface of the phosphor plate described above is, for example, 0.1 μm or more and 2.0 μm or less, and preferably 0.3 μm or more and 1.5 μm or less.

On the other hand, a surface roughness Ra on the back surface of the phosphor plate described above is, for example, 0.1 μm or more and 2.0 μm or less, and preferably 0.3 μm or more and 1.5 μm or less.

By setting the above surface roughness to the above upper limit value or less, it is possible to suppress variations in the light extraction efficiency or the light intensity in an in-plane direction. By setting the above surface roughness to the above lower limit value or more, it is expected that the adhesion to an adherend can be enhanced.

In the phosphor plate described above, an upper limit value of a light transmittance in the blue light of 450 nm is, for example, 10% or less, preferably 5% or less, and more preferably 1% or less. As a result, it is possible to suppress the blue light transmitted through the phosphor plate, so that it is possible to emit the orange light with high luminance. By appropriately adjusting the content of the α-type sialon phosphor or the thickness of the phosphor plate, the light transmittance in the blue light of 450 nm can be reduced.

Note that a lower limit value of the light transmittance in the blue light of 450 nm is not particularly limited, but may be, for example, 0.01% or more.

A manufacturing process of the phosphor plate according to the present embodiment will be described in detail.

A manufacturing method of the phosphor plate according to the present embodiment may include a step (1) of obtaining a mixture containing the metal oxide and the α-type sialon phosphor, and a step (2) of firing the obtained mixture.

In addition, in the manufacturing method of the phosphor plate, the metal oxide may be melted, and the particles of the α-type sialon phosphor may be mixed in the obtained melt.

In the step (1), it is preferable that the powder of the α-type sialon phosphor or the metal oxide used as raw materials have high purity as much as possible, and it is preferable that the impurities of elements other than the constituent elements be 0.1% or less.

Various dry and wet methods can be applied to the mixing of the raw material powder, but a method is preferable in which the α-type sialon phosphor particles used as the raw material are not pulverized as much as possible and the impurities from the device are not mixed as much as possible during mixing.

As the metal oxide of the raw material, a material containing at least one of $Al_2O_3$ powder, $SiO_2$ powder and spinel raw material powder may be used. The sintered material may be used alone or in combination of two or more.

The metal oxide need only be fine powder, and an average particle diameter thereof may be, for example, 1 μm or less.

The alumina powder ($Al_2O_3$) may be used as the metal oxide of the raw material.

An upper limit of a BET specific surface area of the alumina powder used is, for example, 10.0 $m^2/g$ or less, preferably 9.0 $m^2/g$ or less, more preferably 8.0 $m^2/g$ or less, and still more preferably 6.0 $m^2/g$. As a result, it is possible to suppress the blackening of the phosphor plate. On the other hand, a lower limit of the BET specific surface area of the alumina powder is, for example, 0.1 $m^2/g$ or more, preferably 0.5 $m^2/g$ or more, more preferably 1.0 $m^2/g$ or more, and still more preferably 2.0 $m^2/g$. As a result, it is possible to enhance a degree of sintering of the alumina powder and to form the dense composite.

In the step (2), the mixture of the alumina powder and the α-sialon phosphor powder may be fired at 1300° C. or higher and 1650° C. or lower, for example. A heating temperature in a sintering step is more preferably 1500° C. or higher. In order to densify the composite, it is preferable that the firing temperature be high, but in a case in which the firing temperature is too high, the phosphor reacts with the alumina and the fluorescence intensity of the phosphor plate is decreased, so the range described above is preferable.

In addition, in a case in which the firing temperature is in a high temperature region of about 1600° C. to 1650° C., a maintaining time for maintaining this temperature is, for example, 20 minutes or less, preferably 15 minutes or less, and may be 0 minutes. As a result, it is possible to enhance the light emission intensity of the phosphor plate.

Glass powder (powder containing $SiO_2$) may be used as the metal oxide of the raw material.

As the glass powder, the $SiO_2$ powder (silica powder) or a general glass raw material can be used. The sintered material may be used alone or in combination of two or more.

The spinel raw material powder may be used as the metal oxide of the raw material.

Here, the "spinel raw material powder" is, for example, (i) powder containing the spinel represented by the general formula $M_{2x}Al_{4-4x}O_{6-4x}$ described above, and/or (ii) a mixture of the powder of the metal oxide represented by the general formula MO (M is at least any of Mg, Mn, and Zn) and the powder of $Al_2O_3$.

In the step (2), the spinel raw material powder may be fired at, for example, 1300° C. or higher and 1650° C. or lower. A heating temperature in a sintering step is more preferably 1500° C. or higher. In order to densify the composite, it is preferable that a firing temperature be high, but in a case in which the firing temperature is too high, the fluorescence intensity of the phosphor plate is decreased, so the range described above is preferable.

In addition, in a case in which the firing temperature is in a high temperature region of about 1600° C. to 1650° C., a maintaining time for maintaining this temperature is, for example, 20 minutes or less, preferably 15 minutes or less, and may be 0 minutes. As a result, it is possible to enhance the light emission intensity of the phosphor plate.

In the manufacturing method described above, a firing method may be normal pressure sintering or pressure sintering, but in order to suppress the decrease in a characteristic of the α-type sialon phosphor and obtain the dense composite, the pressure sintering, which is easier to make the composite denser than the normal pressure sintering, is preferable.

Examples of the pressure sintering method include hot press sintering, spark plasma sintering (SPS), and hot isostatic pressing (HIP). In a case of the hot press sintering or the SPS sintering, the pressure is 10 MPa or more, preferably 30 MPa or more, and preferably 100 MPa or less.

A firing atmosphere is preferably a non-oxidizing inert gas, such as nitrogen or argon, or a vacuum atmosphere for the purpose of preventing the oxidation of the α-sialon.

From the above, the phosphor plate according to the present embodiment is obtained.

The surface of the plate-like composite in the obtained phosphor plate may be subjected to known surface treatment, such as polishing treatment, plasma treatment, or surface coating treatment, in a range in which the effects of the present invention are not impaired.

The light emitting device according to the present embodiment will be described.

The light emitting device according to the present embodiment includes a group III nitride semiconductor light emitting element (light emitting element 20), and a phosphor plate 10 described above provided over one surface of the group III nitride semiconductor light emitting element. The group III nitride semiconductor light emitting element includes, for example, an n layer, a light emitting layer, and a p layer composed of a group III nitride semiconductor, such as an AlGaN-based, GaN-based, or InAlGaN-based material. As the group III nitride semiconductor light emitting element, a blue LED that emits the blue light can be used.

The phosphor plate 10 may be disposed directly over one surface of the light emitting element 20, but can be disposed through a light transmitting member or a spacer.

As the phosphor plate 10 disposed over the light emitting element 20, a disk-like phosphor plate 100 (phosphor wafer) shown in FIG. 1 may be used, but an individually separated phosphor plate 100 can be used.

FIG. 1 is a schematic view showing an example of a configuration of the phosphor plate.

The thickness of the phosphor plate 100 shown in FIG. 1 is appropriately set in accordance with the intended use. A lower limit of the thickness of the phosphor plate 100 is, for example, 50 μm or more, preferably 80 μm or more, and more preferably 100 μm or more. An upper limit of the thickness of the phosphor plate 100 is, for example, 1 mm or less, preferably 500 μm or less, and more preferably 300 μm or less.

The thickness of the phosphor plate 100 can be appropriately adjusted by grinding or the like after being obtained in the manufacturing process described above.

Note that, since the occurrence of chipping or cracking at the corners is suppressed as compared with a case of a rectangular shape, the disk-like phosphor plate 100 is excellent in the durability and the transportability.

An example of a semiconductor device described above is shown in FIGS. 2A and 2B. FIG. 2A is a cross-sectional view schematically showing a configuration of a flip-chip type light emitting device 110, and FIG. 2B is a cross-sectional view schematically showing a configuration of a wire bonding type light emitting device 120.

The light emitting device 110 of FIG. 2A has a substrate 30, a light emitting element 20 electrically connected to the substrate 30 through a solder 40 (die bond material), and the phosphor plate 10 provided over a light emitting surface of the light emitting element 20. The flip-chip type light emitting device 110 may have any one of a face-up type structure and a face-down type structure.

In addition, the light emitting device 120 of FIG. 2B has the substrate 30, the light emitting element 20 electrically connected to the substrate 30 through a bonding wire 60 and an electrode 50, and the phosphor plate 10 provided over the light emitting surface of the light emitting element 20.

In FIGS. 2A and 2B, the light emitting element 20 and the phosphor plate 10 are attached by a known method, and, for example, may be adhered by a silicone-based adhesive or a heat fusion method.

In addition, the light emitting device 110 and the light emitting device 120 may be entirely sealed with a transparent sealing material.

Note that the individually separated phosphor plate 10 may be attached to the light emitting element 20 mounted on the substrate 30. A plurality of the light emitting elements 20 may be attached to the large-area phosphor plate 100, and then the light emitting elements 20 with the phosphor plate 10 may be individually separated by dicing. In addition, the large-area phosphor plate 100 may be attached to a semiconductor wafer on which the plurality of light emitting elements 20 are formed on a surface thereof, and then the semiconductor wafer and the phosphor plate 100 may be individually separated at a time.

Although the embodiment of the present invention has been described above, the embodiment is an example of the present invention, and various configurations other than the above can be adopted. Note that the present invention is not limited to the embodiment described above, and modifications, improvements, and the like in a range in which the object of the present invention can be achieved are included in the present invention.

EXAMPLES

In the following, the present invention will be described in detail with reference to examples, but the present invention is not limited to the description of these examples.

<Manufacturing of Phosphor Plate>

Example 1

As the raw material of the phosphor plate of Example 1, the alumina powder (AA-03 (manufactured by Sumitomo Chemical Co., Ltd., BET specific surface area: 5.2 m²/g), and Ca-α-type sialon phosphor (average particle diameter $D_{50}$: 6.07 μm) were used.

7.857 g of the alumina powder and 2.833 g of the Ca-α-type sialon phosphor powder were weighed and dry-mixed with an agate mortar. The mixed raw material was disaggregated through a nylon mesh sieve having an opening of 75 μm to obtain raw material mixed powder. Note that a blending ratio calculated from the true density of the raw materials (alumina: 3.97 g/cm³ and Ca-α-type sialon phosphor: 3.34 g/cm³) is alumina:Ca-α-type sialon phosphor=70:30 Vol %.

A carbon die having an inner diameter of 30 mm in which a carbon lower punch was set was filled with about 11 g of the raw material mixed powder, a carbon upper punch was set, and the raw material powder was interposed therebetween. Note that a carbon sheet (GRAFOIL manufactured by GraTech) having a thickness of 0.127 mm was set between the raw material mixed powder and a carbon jig to prevent sticking.

A hot press jig filled with this raw material mixed powder was set in a multipurpose high temperature furnace (manufactured by Fujidempa Kogyo Co., Ltd., Hi multi 5000) with a carbon heater. An inside of the furnace was evacuated to 0.1 Pa or less, and the upper and lower punches were pressurized with a press pressure of 55 MPa while maintaining a reduced pressure state. While maintaining a pressurized state, the temperature was raised to 1600° C. at a rate of 5° C. per minute. Heating was stopped immediately after the temperature reached 1600° C., the temperature was slowly cooled to a room temperature, and the pressure was depressurized (firing step). Then, a fired product having an outer diameter of 30 mm was collected, and an outer peripheral portion was ground by using a surface grinding machine and a cylindrical grinding machine to obtain the disk-like phosphor plate having a diameter of 25 mm and a thickness of 2=.

Example 2

A phosphor plate was obtained in the same manner as in Example 1 except that, in the firing step described above, after the temperature reached 1600° C., the temperature was maintained at 1600° C. for 10 minutes, heating was stopped, the temperature was slowly cooled to the room temperature, and the pressure was depressurized.

Example 3

A phosphor plate was obtained in the same manner as in Example 1 except that the temperature was raised to 1650° C. in the firing step described above.

Example 4

A phosphor plate was obtained in the same manner as in Example 1 except that a Ca-α-type sialon phosphor (average particle diameter $D_{50}$: 3.71 μm) was used instead of the Ca-α-type sialon phosphor of Example 1.

Example 5

A phosphor plate was obtained in the same manner as in Example 1 except that 5.135 g of the alumina powder ($Al_2O_3$, manufactured by Sumitomo Chemical Co., Ltd., AA-03) as the spinel raw material powder, 2.030 g of magnesia powder (MgO, manufactured by FUJIFILM Wako Pure Chemical Corporation, average particle diameter 0.2 μm, purity 99.9%) were used instead of the alumina powder of Example 1.

Comparative Example 1

A phosphor plate was obtained in the same manner as in Example 1 except that, in the firing step described above, after the temperature reached 1600° C., the temperature was maintained at 1600° C. for 30 minutes, heating was stopped, the temperature was slowly cooled to the room temperature, and the pressure was depressurized.

Comparative Example 2

A phosphor plate was obtained in the same manner as in Example 1 except that the temperature was raised to 1700° C. in the firing step described above.

TABLE 1

| | Phosphor D50 (μm) | Firing temperature (° C.) | Maintaining time/min | Peak intensity ratio ($I_\beta/I_\alpha$) | Relative light emission intensity (%) |
|---|---|---|---|---|---|
| Example 1 | 6.07 | 1600 | 0 | 2.2 | 100 |
| Example 2 | 6.07 | 1600 | 10 | 3.5 | 98 |
| Example 3 | 6.07 | 1650 | 0 | 5.8 | 91 |
| Example 4 | 3.71 | 1600 | 0 | 7.0 | 101 |
| Example 5 | 6.07 | 1600 | 0 | 2.3 | 98 |
| Comparative Example 1 | 6.07 | 1600 | 30 | 16.0 | 79 |
| Comparative Example 2 | 6.07 | 1700 | 0 | 59.5 | 40 |

The obtained phosphor plates were evaluated based on the evaluation items described below.

[X-Ray Diffraction Analysis Pattern]

For the phosphor plate of each Example and each Comparative Example, the diffraction pattern was measured under the following measurement conditions using an X-ray diffraction device (product name: Ultima IV, manufactured by Rigaku Corporation).

(Measurement Conditions)

X-ray source: Cu-Kα ray (λ=1.54184 Å)
Output setting: 40 kV·40 mA
Optical condition at the time of measurement: divergence slit=⅔°
Scattering slit=8 mm
Light receiving slit=open
Position of diffraction peak=2θ(diffraction angle)
Measurement range: 2θ=20° to 40°
Scan speed: 0.5 degrees (2θ)/sec, continuous scan
Sample preparation: the plate-like phosphor plate was placed on the sample holder.

The peak intensity was a value obtained by performing background correction.

As a result of the measurement of the X-ray diffraction analysis pattern, it was confirmed that, in the phosphor plate of each Example and each Comparative Example, the peak corresponding to the α-type sialon phosphor ((201) plane of Ca-α-SiAlON) having the diffraction angle 2θ in the range of 30.2° or more and 30.4° or less was present, and the peak corresponding to the β-type sialon ((200) plane of (β-SiAlON) having the diffraction angle 2θ in the range of 26.6° or more and 26.8° or less was present. The peak intensities were measured, the peak intensity corresponding to the Ca-α-SiAlON described above was defined as $I_\alpha$, the peak intensity corresponding to β-SiAlON described above was defined as $I_β$, and values of the peak intensity ratio ($I_β/I_α$) were shown in Table 1.

[Evaluation of Optical Characteristic]

The phosphor plate obtained in each Example and Comparative Example was further ground by a surface grinding machine to obtain a test phosphor plate having a plate thickness of about 0.22 mm, and the fluorescence intensity was measured using the test phosphor plate in accordance with the following procedure by using a device shown in FIG. 3.

FIG. 3 is a schematic view of a device (chip-on-board type (COB type) LED package 130) that measures the light emission spectrum of the test phosphor plate (phosphor plate 100).

The procedure for evaluating the optical characteristic will be described. First, an aluminum substrate (substrate 30) on which the phosphor plate 100 and a recess 70 were formed was prepared. A diameter φ of a bottom surface of the recess 70 was set to 13.5 mm, and a diameter φ of an opening of the recess 70 was set to 16 mm.

Next, the blue LED (light emitting element 20) was mounted as a blue light emitting light source inside the recess 70 of the substrate 30.

Next, the circular phosphor plate 100 is installed above the blue LED so as to close the opening of the recess 70 of the substrate 30 to manufacture the device (chip-on-board type (COB type) LED package 130) shown in FIG. 3.

Thereafter, the light emission spectrum on the surface of the phosphor plate 100 when the blue LED of the manufactured LED package 130 is turned on was measured by using a total luminous flux measurement system (HalfMoonN/φ1000 mm integrating sphere system, manufactured by OTSUKA ELECTRONICS CO., LTD).

In the obtained light emission spectrum, a maximum value (W/nm) of the fluorescence intensity of the orange light (orange) having a wavelength of 585 nm or more and 605 nm was obtained. Table 1 shows relative values (%) of the other Examples and Comparative Examples when the maximum value of the fluorescence intensity was standardized with Example 1 as 100%.

It was shown that the phosphor plates of Examples 1 to 5 showed results that the fluorescence intensity was excellent as compared with those of Comparative Examples 1 and 2.

This application claims priority based on Japanese Patent Application No. 2020-019401 filed on Feb. 7, 2020, the entire disclosure of which is incorporated herein by reference.

REFERENCE SIGNS LIST

10: phosphor plate
20: light emitting element
30: substrate
40: solder
50: electrode
60: bonding wire
70: recess
100: phosphor plate
100: light emitting device
120: light emitting device
130: LED package

The invention claimed is:

1. A phosphor plate comprising:
a plate-like composite including a base material and α-type sialon phosphor present in the base material,
wherein, in an X-ray diffraction analysis pattern of the phosphor plate using a Cu-Kα ray, in a case in which peak intensity corresponding to the α-type sialon phosphor having a diffraction angle 2θ in a range of 30.2° or more and 30.4° or less is defined as $I_α$ and peak intensity of a peak having a diffraction angle 2θ in a range of 26.6° or more and 26.8° or less is defined as $I_β$, $I_α$ and $I_β$ satisfy $0 < I_β/I_α ≤ 10$.

2. The phosphor plate according to claim 1,
wherein the base material is composed of a sintered material of metal oxide containing at least one of a sintered material of $Al_2O_3$, a sintered material of $SiO_2$, and spinel $M_{2x}Al_{4-4x}O_{6-4x}$ (where, M is at least any of Mg, Mn, and Zn, and $0.2 < x < 0.6$).

3. The phosphor plate according to claim 1,
wherein a content of the α-type sialon phosphor is 5 Vol % or more and 50 Vol % or less in terms of volume in a volume of 100 Vol % of the base material.

4. The phosphor plate according to claim 1,
wherein an average particle diameter D50 of the α-type sialon phosphor is 1 μm or more and 30 μm or less.

5. The phosphor plate according to claim 1,
wherein a thickness of the phosphor plate is 50 μm or more and 1 mm or less.

6. The phosphor plate according to claim 1,
wherein the phosphor plate is used as a wavelength converter that converts radiated blue light into orange light to emit the converted orange light.

7. The phosphor plate according to claim 1,
wherein a light transmittance in blue light of 455 nm is 10% or less.

8. The phosphor plate according to claim 1,
wherein the peak having the diffraction angle 2θ in the range of 26.6° or more and 26.8° or less corresponds to β-type sialon.

9. A light emitting device comprising:
a group III nitride semiconductor light emitting element; and
the phosphor plate according to claim 1 provided over one surface of the group III nitride semiconductor light emitting element.

* * * * *